(12) United States Patent
White

(10) Patent No.: US 6,446,707 B1
(45) Date of Patent: Sep. 10, 2002

(54) ACTIVE HEAT SINK STRUCTURE WITH DIRECTED AIR FLOW

(75) Inventor: Joseph M White, Windsor, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/836,759

(22) Filed: Apr. 17, 2001

(51) Int. Cl.7 .................................................. F28F 7/00
(52) U.S. Cl. ...................... 165/80.3; 165/121; 361/697; 257/722
(58) Field of Search .............................. 165/80.3, 121, 165/185; 174/16.3; 361/697; 415/178; 257/722

(56) References Cited

U.S. PATENT DOCUMENTS

| | | | | |
|---|---|---|---|---|
| 4,918,571 A | * | 4/1990 | Grabbe ....................... | 174/16.3 |
| 6,179,046 B1 | * | 1/2001 | Hwang et al. .............. | 165/80.3 |
| 6,196,300 B1 | * | 3/2001 | Checchetti ................. | 165/80.3 |
| 6,244,331 B1 | * | 6/2001 | Budelman .................. | 165/80.3 |
| 6,295,202 B1 | * | 9/2001 | Tucker et al. ............... | 361/704 |

* cited by examiner

Primary Examiner—Henry Bennett
Assistant Examiner—Terrell McKinnon

(57) ABSTRACT

An active heat sink structure includes at least one heat sink. Each heat sink includes a heat sink base having a top surface with a top surface periphery and a top surface center, and an oppositely disposed bottom surface. The heat sink may be described in relation to a first reference line lying in the top surface and a second reference line lying in the top surface and perpendicular to the first reference line. Where there is more than one heat sink, the heat sinks lie adjacent to each other along the first reference line. A plurality of air flow paths are defined on the top surface of the heat sink base, preferably by fins extending perpendicular to the top surface. Substantially all of the air flow paths direct a flow of air from the top surface center toward the top surface periphery and substantially parallel to the second reference line. An air-flow source such as a fan directs air into the plurality of air flow paths from a location at about the top surface center.

16 Claims, 2 Drawing Sheets

ACTIVE HEAT SINK STRUCTURE WITH DIRECTED AIR FLOW

This invention relates to an active heat sink structure and, more particularly, to such an active heat sink structure that optimizes cooling performance when a number of individual heat sinks are arranged in a side-by-side fashion.

BACKGROUND OF THE INVENTION

The performance of heat-producing electronic, electrical, and other devices is often limited by the heat produced during service. If the heat cannot be dissipated, the temperature of the device increases beyond its operating limit, leading to shutdown or failure. Additionally, the reliability of many devices falls as their temperature increases. Heat dissipation problems are increased when several heat-producing devices are positioned close to each other.

Heat-producing devices are often mounted to heat sink structures to aid in the dissipation of the heat. Heat sink structures may be passive or active. In a typical active heat sink, also sometimes called a turbo cooler, a fan is mounted to a top surface of a heat sink base and directs a flow of air against that surface. The heat-producing device is also mounted to the heat sink base, typically on the opposite bottom surface. Heat flows from the heat-producing device into the heat sink base and to the top surface, and from there to the surrounding air. The air flow from the fan increases the heat transfer rate from the top surface into the surrounding air.

This type of active heat sink structure works well when the heat sink is relatively isolated from other heat sinks. However, the inventor has observed that the efficiency of heat removal is reduced when several of the heat-producing devices mounted to their respective heat sinks are positioned laterally adjacent to each other. The result is that the temperatures of the heat-producing devices are sometimes greater than would be the case for isolated heat sinks.

There is a need for an improved approach to heat sinks that improves their cooling efficiency, particularly when a number of heat-producing devices are mounted laterally adjacent to each other. The present invention fulfills this need, and further provides related advantages.

SUMMARY OF THE INVENTION

The present invention provides an active heat sink structure that achieves improved cooling efficiency, particularly where there are two or more heat sinks arranged together in a laterally adjacent, side-by-side fashion. The present approach is implemented without substantial additional cost in the production of the heat sinks.

In accordance with the invention, an active heat sink structure comprises at least one heat sink. Each heat sink comprises a heat sink base having a top surface with a top surface periphery and a top surface center, and an oppositely disposed bottom surface. The heat sink may be described in relation to a first reference line lying in the top surface and a second reference line lying in the top surface and perpendicular to the first reference line. A plurality of air flow paths are defined on the top surface of the heat sink base. The air flow paths are preferably defined by fins extending outwardly from the top surface of the heat sink base. Substantially all of the air flow paths direct a flow of air from the top surface center toward the top surface periphery and substantially parallel to the second reference line, which thereby serves as a common air-flow direction. An air-flow source, such as a fan affixed to the heat sink base, directs air into the plurality of air flow paths from a location at about the top surface center. There is typically a heat-producing device affixed to the bottom surface of the heat sink base.

The heat sink base may be flat, but it is preferably contoured so that the top surface slopes downwardly and away from the top surface center. That is, a thickness of the heat sink base, as measured by a distance between the top surface and the bottom surface, is greater at the top surface center than at the top surface periphery.

The heat sink structure is operable with a single heat sink. Its greatest advantages are realized, however, where there are at least two heat sinks with their respective top surfaces facing parallel to a third reference line lying perpendicular to the first reference line and perpendicular to the second reference line. The heat sinks lie laterally adjacent to each other along the first reference line. In that instance, the air flow is directed parallel to the second reference line and thence perpendicular to the first reference line so that the air flows of adjacent heat sinks do not impinge upon each other.

A source of the inefficiency observed in conventional planar arrays of side-by-side active heat sinks is the impingement of the cooling air flows of the adjacent active heat sinks. When two air flows of adjacent heat sinks impinge, the interference of the two air flows produces turbulence and a gaseous impedance that reduces the flow rate of each of the air flows. The effectiveness of the cooling air over the affected portions of the two heat sinks is thereby reduced, and the temperature of the heat sink and the cooled device rise. The present approach overcomes this loss of effectiveness by directing the cooling air flows of the adjacent heat sinks parallel to each other (i.e., parallel to the second reference line) so that they do not impinge upon each other and produce an impedance to the air flow. The result is that the heat sinks of the array retain their cooling efficiencies and thence their desired temperature.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
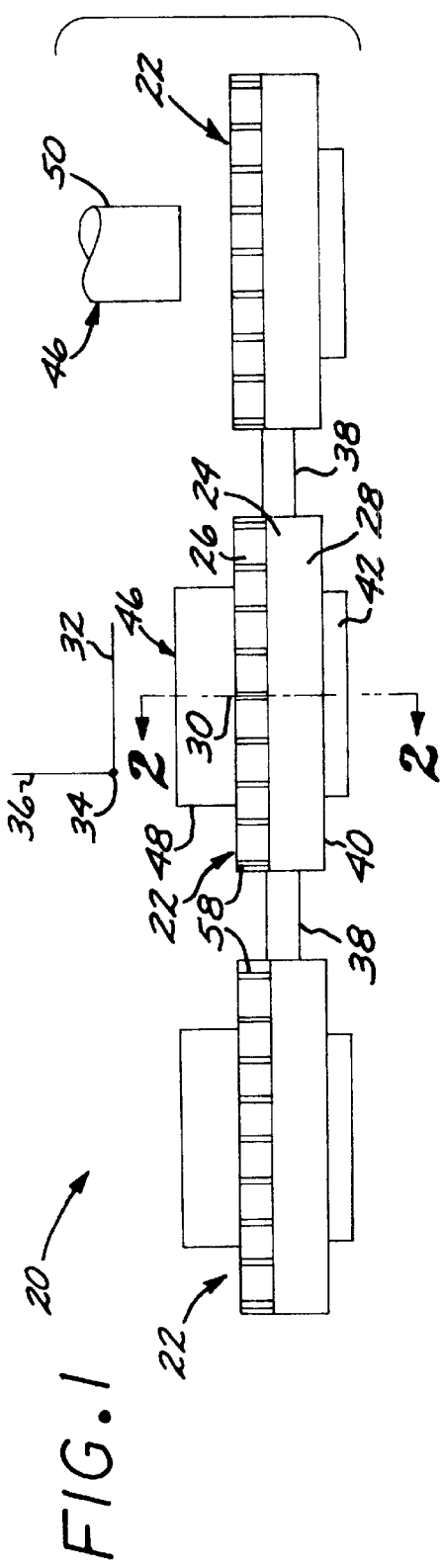
FIG. 1 is an elevational view of a heat sink structure.
Figure 2:
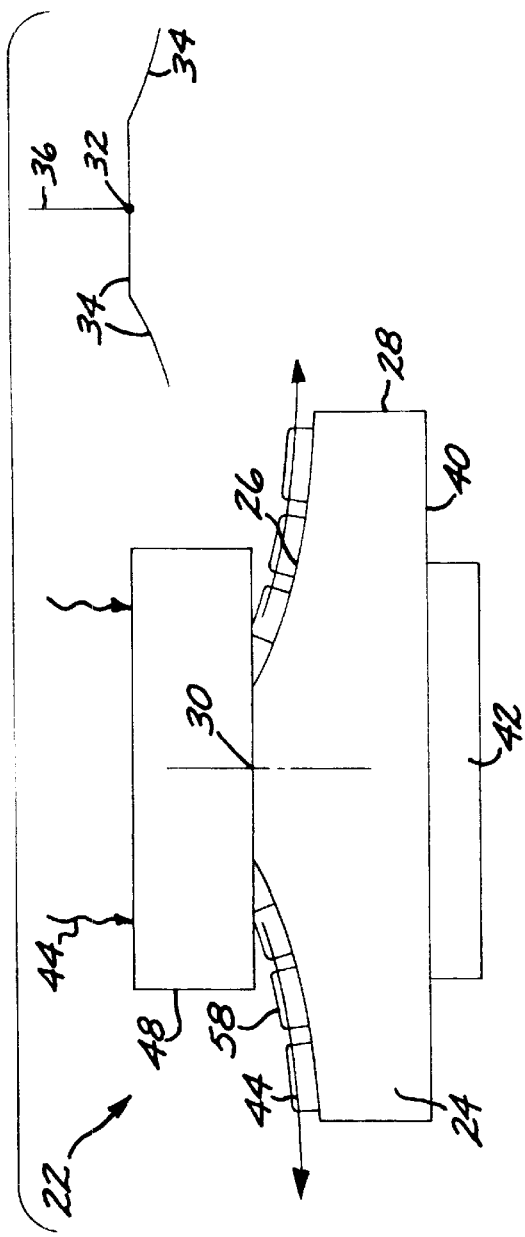
FIG. 2 is an enlarged sectional view through the heat sink structure of FIG. 1, taken on lines 2—2.

FIGS. 1 and 2 depict an active heat sink structure 20 having at least one, and in the illustrated case three, heat sinks 22. Each heat sink 22 has a heat sink base 24 with a top surface 26 having a top surface periphery 28 and a top surface center 30. The features of the heat sinks 22 and the interrelation of the heat sinks 22 are described in relation to a first reference line 32 lying in the top surface 26 and in the plane of the page of the illustration of FIG. 1; and a second reference line 34 perpendicular to the first reference line 32, and perpendicular to the plane of the page of the illustration of FIG. 1. (A reference line extending perpendicular to the plane of the page is indicated by a dot in the figures.) The second reference line 34 lies in the top surface 26 at the top surface center 30, in the illustrated embodiment, but it may be curved as necessary to follow the curvature of the top surface 26 further from the point of intersection with the first reference line 34. In the active heat sink structure 20 of FIG. 1, the respective top surfaces 26 of the heat sinks 22 all face parallel to a surface-normal third reference line 36 lying perpendicular to the first reference line 32 and perpendicular to the second reference line 34. The top surface center 30 is preferably flat and lies perpendicular to the third reference line 36. The third reference line 36 lies in the plane of the illustration in FIG. 1 and in FIG. 2. The reference lines 32, 34, and 36 are not physical features, but are imaginary reference lines defined to aid in the description of the physical features and the air flow directions. They define an orthogonal set of axes at their point of intersection.

Figure 3:
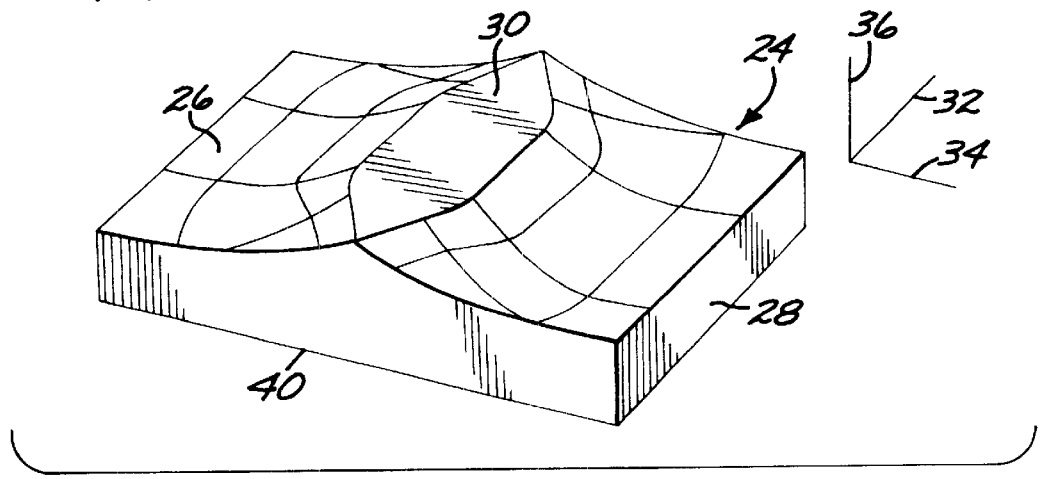
FIG. 3 is a perspective view of one of the heat sink bases with the air flow paths omitted.

In a preferred configuration of the heat sink base 24, the top surface 26 slopes downwardly and away from the top surface center 30 along the second reference line 34. Stated alternatively, a thickness of the heat sink base 24, as measured by a distance between the top surface 26 and a bottom surface 40, is greater at the top surface center 30 than at the top surface periphery 28 (when the measurement is conducted at a series of points along the second reference line 34), as seen in FIG. 2. FIG. 3 illustrates the preferred shape of the heat sink base 24 in perspective, so that the flat and contoured portions of the top surface 26 may be seen more clearly. (In FIG. 3, the fins to be discussed subsequently are omitted for clarity, and the second reference line 34 is shown near the origin and is therefore not curved near its end.)

The three heat sinks 22 of FIG. 1 lie laterally adjacent to each other and spaced along the first reference line 32. The three heat sinks 22 are mounted to a common support 38 in the illustrated embodiment.

The heat sink base 24 has the bottom surface 40 that is oppositely disposed to the top surface 26. In the usual case, a device 42 is affixed to the bottom surface 40 of the heat sink base 24. The device 42 produces heat that is dissipated by the heat sink 22. The device 42 may be of any operable type, but it is typically a microelectronic device or a discrete heat-producing device.

An air flow is directed against the top surface 26 of the heat sink base 24. This air flow, indicated by arrows 44 in FIG. 2, aids in the convective removal of heat from the top surface 26 that has diffused through the heat sink base 24 and to the top surface 26 from the device 42. The air flow 44 is produced by an air-flow source 46. The air-flow source 46 may be of any operable type, and two examples are illustrated in FIG. 1. The air-flow source 46 may be a fan, such as a fan 48 affixed to the top surface center 30 of the heat sink base 24. The air-flow source may instead be a duct 50 that supplies the air flow 44 from a common pressure source (not shown).

Figure 4:
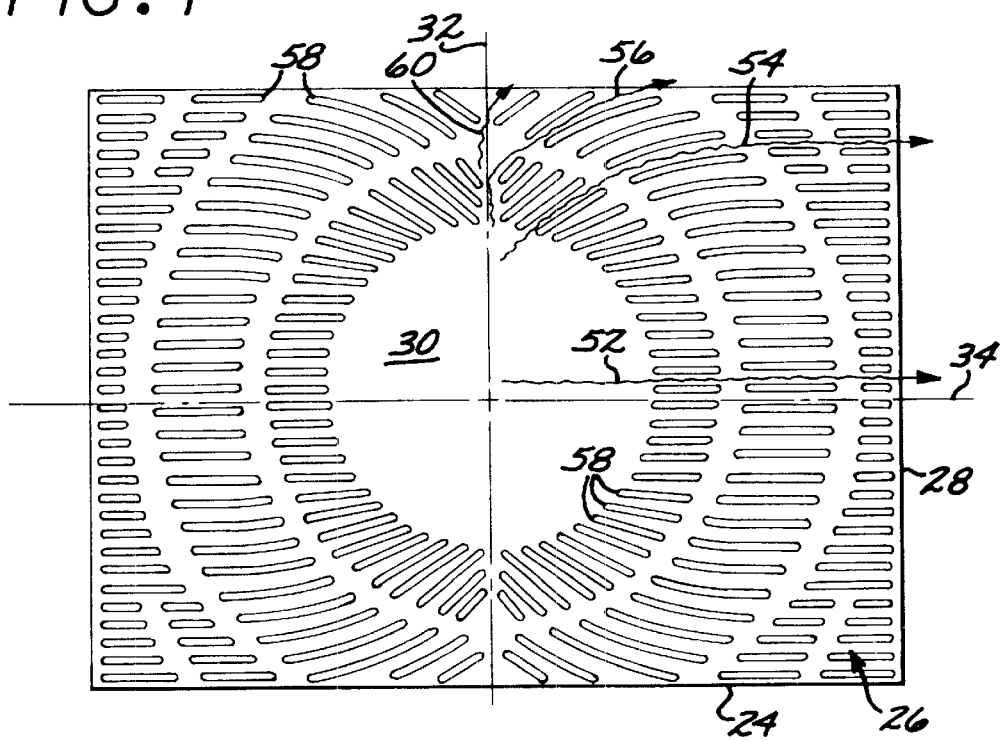
FIG. 4 is a plan view of the heat sink base of FIG. 2, showing a pattern of air flow paths and fins.

As shown in FIGS. 1, 2, and 4, a plurality of air flow paths are defined on the top surface 26 of the heat sink base 24. For use in subsequent discussion, three exemplary air flow paths 52, 54, and 56 are illustrated in FIG. 4. Each of the air flow paths 52, 54, and 56 extends from a location at about the top surface center 30 toward the top surface periphery 28. (The illustrated heat sink base 24 is two-fold symmetric about the first reference line 32 in the plan view of FIG. 4. The discussion applies equally to air flow paths extending to the left and to the right of the first reference line 32.) The air flow paths 52, 54, and 56 are all preferably defined and shaped by fins 58 extending outwardly from the top surface 26 of the heat sink base 24, so that the air flows in the spaces between the fins 58. The fins 58 may be straight or curved, depending upon their locations. The fins 58 may be produced by any operable technique, such as, for example, impact extrusion, folding sheet metal to define the fins, machining, sawing, affixing of discrete blades to the heat sink base, or the like.

Substantially all of the air flow paths, including the exemplary air flow paths 52, 54, and 56, direct a flow of air from the top surface center 30 toward the top surface periphery 28 and substantially parallel to the second reference line 34 upon reaching the top surface periphery 28. The second reference line 34 thereby serves as a common air-flow direction lying perpendicular to the first reference line 32. Any air flow in the direction parallel to the first reference line 32 impinges upon the corresponding air flow from the adjacent heat sink 22, leading to turbulence and an airflow impedance that reduces the efficiency of the forced air cooling of the top surface 26 of the heat sink base 24. For this reason, the arrangement of the fins 58 that define the air flow paths 52, 54, and 56 is such as to direct the air flows into the direction substantially parallel to the second reference line 34 (the common air-flow direction). When the air flow paths leave the top surface 26 at the top surface periphery 28, they do not experience a large degree of head-on impingement with the air flow paths of the adjacent heat sinks 22. The result is that the efficiency of the air cooling of the heat sinks is maintained, even when multiple heat sinks are positioned in a side-by-side arrangement along the first reference line 32 as shown in FIG. 1.

The use of the word "substantially" in describing the air flow paths recognizes the realities in the practical utilization of this approach. Specifically, it is not practical to achieve a perfectly uniform air flow parallel to the second reference line 34 in all cases. The present approach achieves a sufficiently large fraction of the air flow parallel to the second reference line 34 that good cooling efficiency is maintained. Referring to FIG. 4, the air flow path 52 (which is initially parallel to the second reference line 34) extends parallel to the second reference line 34 without substantial bending of the air flow path. For a more angularly divergent air flow path 54, there is a degree of bending of the air flow path accomplished by the curvature of the fins 58. The air flow path 56 must be bent even further, and in fact barely reaches an orientation wherein the air flow path 56 is parallel to the second reference line 34. The bending of an air flow itself creates an impedance. Consequently, for even more angularly divergent air flow paths, such as an air flow path 60, the air flow cannot practically be bent to flow exactly parallel to the second reference line 34. The air flow path 60 will therefore experience a degree of impingement with the corresponding air flow path from the adjacent heat sink 22. However, this impingement is at an angle and not head on, which is better than the case where the air flow path 60 is not bent at all. Of course, an air flow path parallel to the first reference line 32 will impinge head on to the corresponding air flow path from the adjacent heat sink 22 to create an impedance, but this impedance represents a very small part of the total air flow. Thus, the present approach, wherein a large majority of the cooling air flow is directed parallel to the second reference line 34 (i.e., away from the neighboring heat sink 22), achieves improved cooling performance as compared with a design wherein the air flows from adjacent heat sinks are allowed to impinge upon each other to a larger degree. The present approach is therefore contrasted with an alternative in which the air flows from each heat sink radially in a generally axisymmetric pattern about the third reference line 36.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An active heat sink structure comprising at least one heat sink, each heat sink comprising:
   a heat sink base having
      a top surface with a top surface periphery and a top surface center, the heat sink being described in relation to a first reference line lying in the top surface and a second reference line lying in the top surface and perpendicular to the first reference line, and
      an oppositely disposed bottom surface, wherein a thickness of the heat sink base, as measured by a distance between the top surface and the bottom surface, is greater at the top surface center than at the top surface periphery;
   a plurality of fins extending outwardly from the top surface of the heat sink base, the fins being oriented to direct a flow of air from the top surface center, along the top surface, toward the top surface periphery, and substantially parallel to the second reference line when the air flow reaches the top surface periphery; and
   an air-flow source directing air into the plurality of air flow paths from a location at about the top surface center.

2. An active heat sink structure comprising at least one heat sink, each heat sink comprising:
   a heat sink base having
      a top surface with a top surface periphery and a top surface center, the heat sink being described in relation to a first reference line lying in the top surface and a second reference line lying in the top surface and perpendicular to the first reference line, wherein the top surface slopes downwardly and away from the top surface center along the second reference line, and
      an oppositely disposed bottom surface;
   a plurality of fins extending outwardly from the top surface of the heat sink base, the fins being oriented to direct a flow of air from the top surface center, along the top surface, toward the top surface periphery, and substantially parallel to the second reference line when the air flow reaches the top surface periphery; and
   an air-flow source directing air into the plurality of air flow paths from a location at about the top surface center.

3. The active heat sink structure of claim 2, wherein the at least one heat sink includes at least two heat sinks with their respective top surfaces facing parallel to a third reference line lying perpendicular to the first reference line and perpendicular to the second reference line, the heat sinks lying laterally adjacent to each other along the first reference line.

4. The active heat sink structure of claim 2, further including
   a device affixed to the bottom surface of the heat sink base.

5. The active heat sink structure of claim 2, wherein the air-flow source is a fan affixed to the heat sink base.

6. An active heat sink structure comprising at least one heat sink, each heat sink comprising:
   a heat sink base having
      a top surface with a top surface periphery and a top surface center, the heat sink being described in relation to a first reference line lying in the top surface and a second reference line lying in the top surface and perpendicular to the first reference line, wherein the top surface slopes downwardly and away from the top surface center along the second reference line, and
      an oppositely disposed bottom surface;
   a plurality of air flow paths defined on the top surface of the heat sink base, substantially all of the air flow paths directing a flow of air from the top surface center toward the top surface periphery and substantially parallel to the second reference line; and
   an air-flow source directing air into the plurality of air flow paths from a location at about the top surface center.

7. An active heat sink structure comprising at least one heat sink, each heat sink comprising:
   a heat sink base having
      a top surface with a top surface periphery and a top surface center, the heat sink being described in relation to a first reference line lying in the top surface and a second reference line lying in the top surface and perpendicular to the first reference line, and
      an oppositely disposed bottom surface, wherein a thickness of the heat sink base, as measured by a distance between the top surface and the bottom surface, is greater at the top surface center than at the top surface periphery;
   a plurality of air flow paths defined on the top surface of the heat sink base, substantially all of the air flow paths directing a flow of air from the top surface center toward the top surface periphery and substantially parallel to the second reference line; and
   an air-flow source directing air into the plurality of air flow paths from a location at about the top surface center.

8. The active heat sink structure of claim 7, wherein the at least one heat sink includes at least two heat sinks with their respective top surfaces facing parallel to a third reference line lying perpendicular to the first reference line and perpendicular to the second reference line, the heat sinks lying laterally adjacent to each other along the first reference line.

9. The active heat sink structure of claim 7, further including a device affixed to the bottom surface of the heat sink base.

10. The active heat sink structure of claim 7, wherein the air flow paths are defined by fins extending outwardly from the top surface of the heat sink base.

11. The active heat sink structure of claim 7, wherein the air-flow source is a fan affixed to the heat sink base.

12. An active heat sink structure comprising at least one heat sink, each heat sink comprising
   a heat sink base having
      a top surface with a top surface periphery and a top surface center, wherein at least a portion of the top surface slopes downwardly and away from the top surface center, and
      an oppositely disposed bottom surface;

a plurality of air flow paths defined on the top surface of the heat sink base, substantially all of the air flow paths directing a flow of air from the top surface center toward the top surface periphery and substantially parallel to a common air-flow direction; and an air-flow source directing air into the plurality of air flow paths from a location at about the top surface center.

13. The active heat sink structure of claim 12, wherein the air-flow source is a fan.

14. The active heat sink structure of claim 12, further including a device affixed to the bottom surface of the heat sink base.

15. The active heat sink structure of claim 12, wherein the air flow paths are defined by fins extending outwardy from the top surface of the heat sink base.

16. The active heat sink structure of claim 12, wherein the at least on heat sink comprises at least two heat sinks spaced laterally adjacent to each other along a first reference line lying in the top surface and perpendicular to the common air flow direction.

* * * * *